United States Patent

Gregor et al.

(10) Patent No.: US 6,335,494 B1
(45) Date of Patent: Jan. 1, 2002

(54) MULTIPLE POWER DISTRIBUTION FOR DELTA-I NOISE REDUCTION

(75) Inventors: Roger P. Gregor, Endicott; James P. Libous, Endwell, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/602,911

(22) Filed: Jun. 23, 2000

(51) Int. Cl.[7] .................................................. H01R 12/04
(52) U.S. Cl. .................. 174/261; 361/780; 361/782; 361/792; 361/793; 361/794; 174/262
(58) Field of Search ................... 174/255, 260, 174/262; 361/780, 782, 792, 793, 794

(56) References Cited

U.S. PATENT DOCUMENTS

| | | | |
|---|---|---|---|
| 4,583,150 A | 4/1986 | Boonstra | |
| 4,675,789 A | * 6/1987 | Kuwabara et al. | 174/262 |
| 5,587,887 A | 12/1996 | Price et al. | |
| 5,616,967 A | 4/1997 | Lee et al. | |
| 5,719,750 A | * 2/1998 | Iwane | 361/794 |
| 5,736,796 A | 4/1998 | Price et al. | |
| 5,761,051 A | 6/1998 | Tran | |
| 5,764,491 A | 6/1998 | Tran | |
| 5,847,936 A | 12/1998 | Forchand et al. | |
| 5,912,809 A | 6/1999 | Steigerwald et al. | |
| 6,191,475 B1 | * 2/2001 | Skinner et al. | 257/700 |

* cited by examiner

*Primary Examiner*—Jeffrey Gaffin
*Assistant Examiner*—José H. Alcala
(74) *Attorney, Agent, or Firm*—McGuireWoods, LLP; John R. Pivnichny

(57) ABSTRACT

Power layers of a multi-layer connection structure forming a power distribution network are partitioned to accommodate all necessary voltages for one or more chips connected thereto in each power layer. By doing so, and rearranging vias as permitted by such partitioning via length is reduced while via numbers can be increased to reduce self-inductance of the structure. Transmission lines formed by conductors in the signal layers are referenced to the correct power supply and return/image currents are made of similar path length and substantially symmetrical for both positive- and negative-going signal transitions. These effects reduce delta-I noise to levels which preserve good signal-to-noise ratios to current and foreseeable reduced signal levels.

14 Claims, 6 Drawing Sheets

MULTIPLE POWER DISTRIBUTION FOR DELTA-I NOISE REDUCTION

BACKGROUND OF THE INVENTION

1. Field of the Invention

The present invention generally relates to electronic circuit packaging and, more particularly, to power distribution for single and multi-chip packages, especially packages including CMOS chips.

2. Description of the Prior Art

Recent advances in performance, integration density and manufacturing economy have made complementary metal-oxide-semiconductor (CMOS) designs the technology of choice for digital processing circuits in virtually all applications except where extreme switching speed approaching microwave frequencies is required. At the current time, a new generation of CMOS technology is introduced every twelve to eighteen months with a 100% increase in integration density and a 20%–30% increase in performance.

Scaling active elements such as transistors to smaller sizes and increased integration density and obtaining higher switching speeds has generally required reduced operating voltages and increased input and output (I/O) connection densities on the package. Each new generation of CMOS technology also represents about a 30% reduction in operating voltage and multiple voltages must be accommodated by I/O connections to allow communication and operation with past (or future) generation devices.

These trends lead to application specific integrated circuits (ASICS), memories, microprocessors and other types of integrated circuits which must include multiple drivers to provide voltages for signals communicated to other chips which operate at voltages different from the voltages at which the integrated circuits themselves are intended to principally operate. These multiple voltages, of course, require separate power distribution networks in the circuit package supporting the chip(s) which contain these drivers. At the same time, high clock speeds and switching frequencies must be maintained for increased numbers of devices which switch simultaneously. Current transients which are caused by core logic and I/O switching activity cause voltage fluctuations in the chip and the package power distribution network due to parasitic inductance in the package, resulting in so-called delta-I noise.

This delta-I noise not only affects on-chip circuits but also transmits through quiet off-chip drivers, and, combined with signal coupled noise and reflection noise, can propagate to receivers. This combined noise tends to increase while signal levels decrease with succeeding generations of technology; significantly reducing the signal-to-noise ratio (SNR) and leading to performance degradation and data integrity concerns, particularly in regard to memory read operations and dynamic logic circuits which are precharged prior to input signal evaluation.

SUMMARY OF THE INVENTION

It is therefore an object of the present invention to provide a power distribution arrangement for single and-or multi-chip packages with significantly reduced parasitic and loop-inductance and consequently reduced delta-I noise.

It is another object of the invention to provide an electronic integrated circuit package having an increased signal-to-noise ratio even when CMOS circuits operating at reduced voltages are included therein.

In order to accomplish these and other objects of the invention, an integrated circuit device and multi-layer connection structure forming a power distribution network for a plurality of voltages and ground are provided comprising alternating layers of patterned conductive layers and insulating layers, alternating patterned conductive layers being power distribution layers and signal layers, respectively, alternating power distribution layers being ground and voltage distribution layers, respectively, and vias selectively connecting selected conducting regions of the patterned conductive layers, wherein a voltage distribution layer is partitioned into respective areas for respective voltages that may appear in signal connections in an adjacent layer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
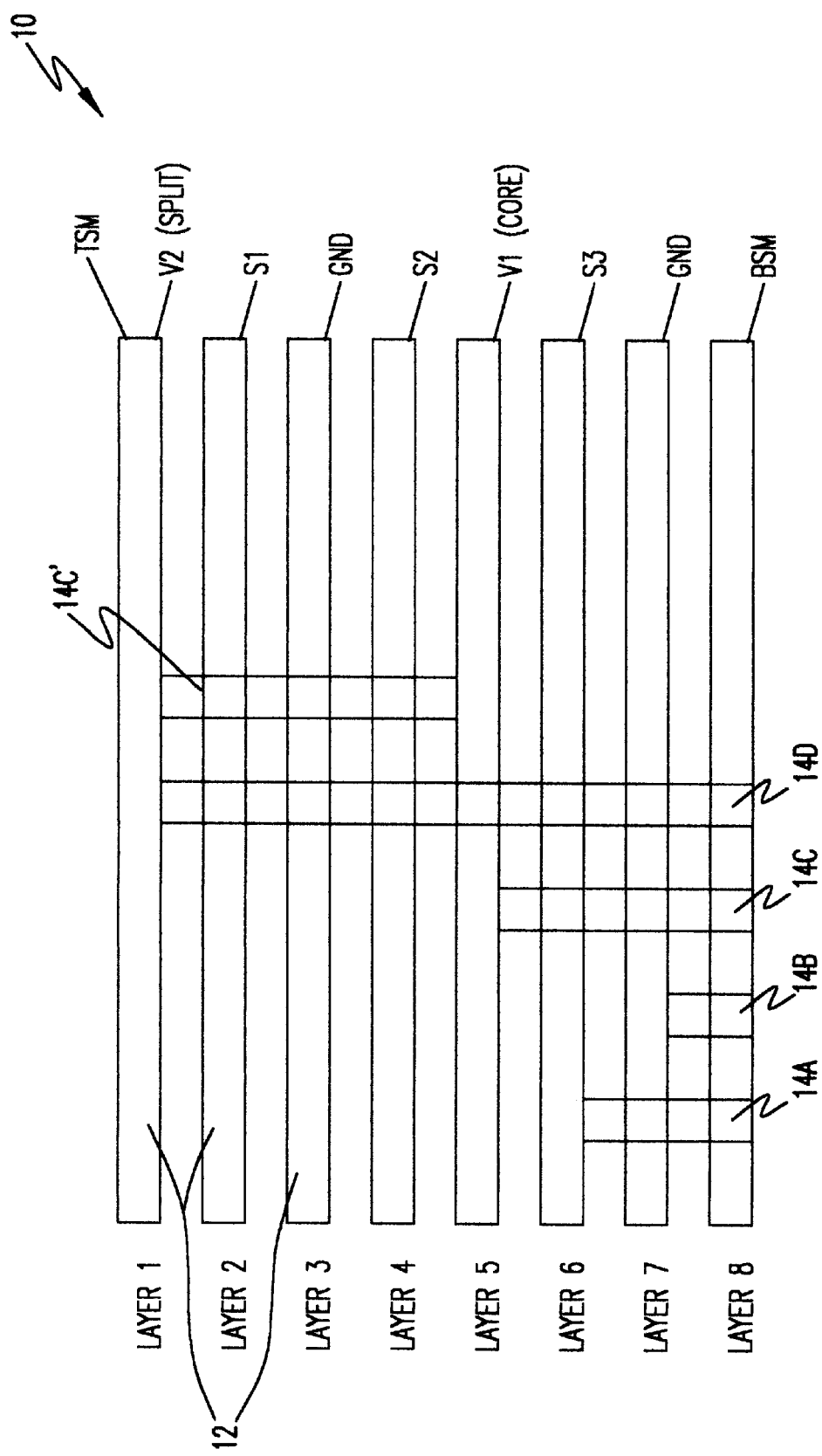
FIG. 1A is a schematic, exploded, side cross-sectional view of an exemplary conventional multi-voltage package design, FIG. 1B includes a portion of the view of FIG. 1A illustrating the generation of delta-I noise in the conventional package design.
Figure 1B:
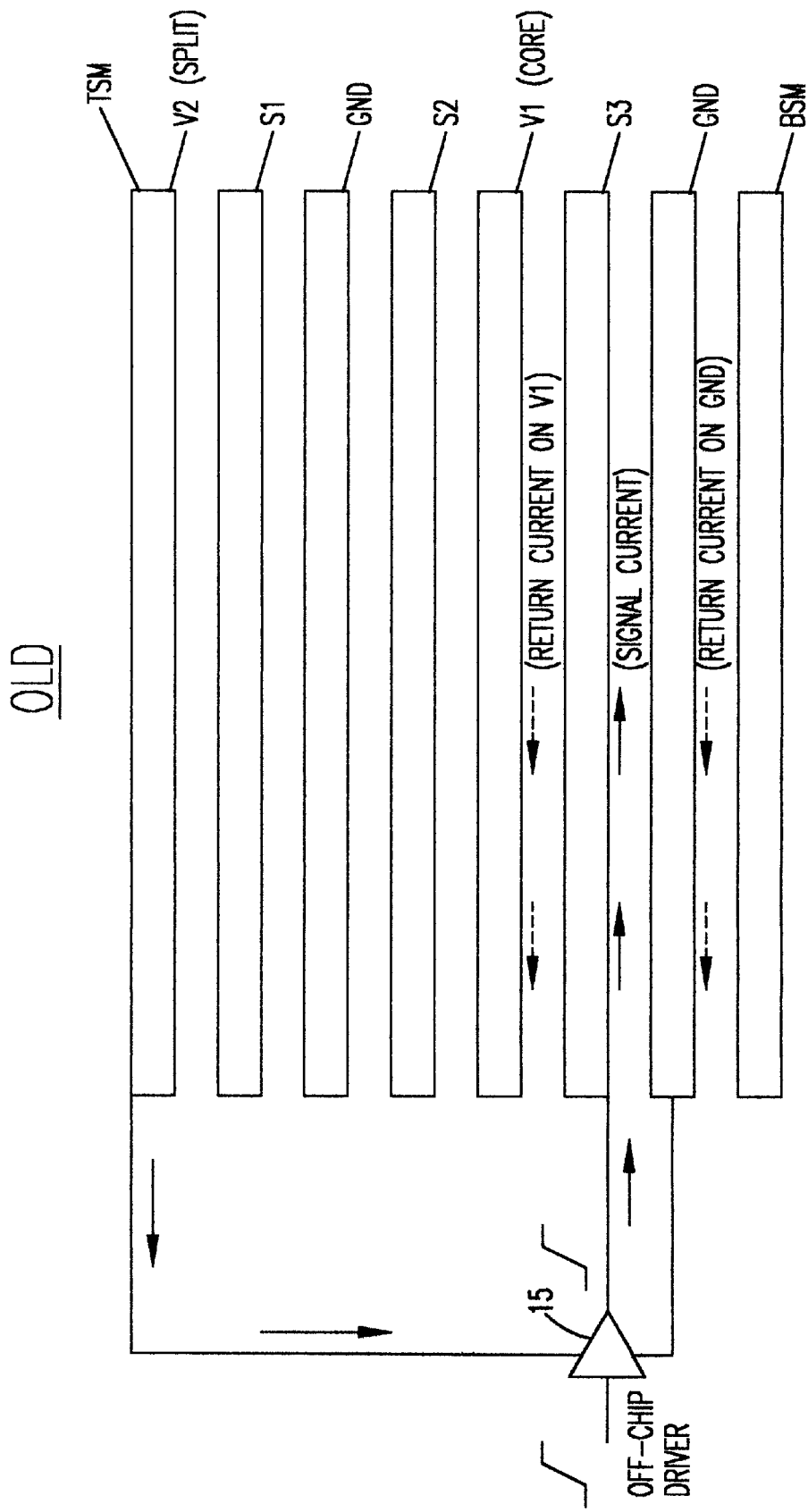
Figure 2:
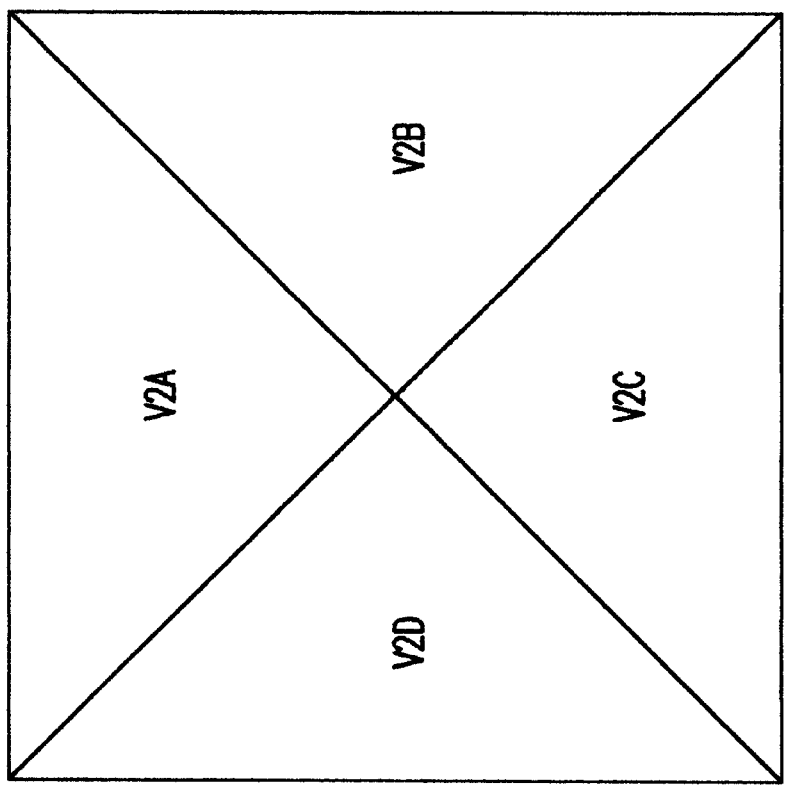
FIG. 2 is a plan view of the partitioned V2 voltage plane of the conventional package of FIG. 1A.

Referring now to the drawings, and more particularly to FIG. 1A, there is shown a schematic representation of a cross-sectional view of the power and signal distribution networks of a conventional electronic integrated circuit package in exploded form, for clarity. While FIGS. 1A, 1B and 2 represent devices over which the present invention represents a significant improvement, the illustrations are arranged to facilitate explanation of the invention and are highly schematic and generalized for that purpose. Therefore no portion of any of these Figures is admitted to be prior art in regard to the present invention. These Figures are, accordingly, labelled "Related Art".

FIG. 1A shows and exemplary eight layer arrangement 10 in which the layers are formed of insulating material 12 such as alumina with patterned conductive material formed thereon by screening or other techniques. Generally, the patterned conductive material will be formed only on the bottom side of each layer except for the top layer which will also have top surface metallurgy (TSM) mostly in the form of patterned connection pads on the top surface, as well. Portions of respective layers are connected by vias such as 14a, 14b, 14c and 14d. The order of layers, regardless of the number of layers, seeks to place ground and power plane layers (e.g. V1, V2 and ground (GND)) between signal layers (e.g. S1, S2 and S3) to provide shielding and reduce capacitive coupling between planes that carry high frequency signals. The networks formed by patterning of the layers are not important to the practice of the invention except to the extent that the connections necessary to support operation of the chip must be provided.

The conductive pattern on the bottom of layer 8 is generally referred to as bottom surface metallurgy (BSM) and will be constructed to support the attachment of package electrical connections such as connection pins or solder balls. For that reason, the BSM layer will generally be much more coarsely patterned than other layers. Patterned conductive material on the top of layer 1 is generally referred to as top surface metallurgy (TSM) which must make connections to the chip or chips that are mounted thereon in the completed package. Therefore the TSM layer is generally the most finely patterned and includes a so-called flip-chip pad layer.

The intermediate layers 2–6 may have conductive areas and vias at any desired pitch, as required to support the package function, and connection pad arrangements in the TSM and BSM layers. In this regard, however, it should be noted that in the arrangement of FIG. 1A, the number of connections by vias such as 14d to the V2 conductive pattern on the bottom of layer 1 will be limited to the number of V2 connections supported by the BSM layer (e.g. the number of BSM pin or ball locations reduced by the number of V1 and ground connections within a given S/P (signal-to-power connection) ratio; tending to concentrate currents in the limited number of vias available. Both the concentration of current and the length of the vias 14d to extend through the full depth of the package increases the self-inductance of the V2 distribution in the package.

If the package is required to support a chip including off-chip drivers which operate at a different voltage than the remainder or another portion of the chip, the V2 layer is generally used to distribute power at the different, generally higher, voltage and, if more than one additional voltage is needed, the V2 layer is also generally partitioned into areas in accordance with the respective voltages (collectively referred to as V2 voltages). An exemplary form of such partitioning is illustrated in plan view in FIG. 2 although it should be understood that such partitioning is substantially arbitrary and not limited to diagonal divisions into quadrants, as shown. Nevertheless, diagonal partitioning is generally desirable since different voltages are generally required principally for off-chip drivers which are often most conveniently placed at the periphery of the chip to ease the package redistribution wiring congestion.

Referring now to FIG. 1B, the development of delta-I noise in the structure of FIG. 1A will now be explained. FIG. 1B shows the same multi-layer structure as illustrated in FIG. 1A and the connection thereto of an exemplary off-chip driver circuit 16. It should be understood that driver circuit 16 is integrated within a chip (generally with numerous similar circuits) mounted on and connected to TSM layer 1 but is illustrated beside the multi-layer structure for clarity in FIG. 1B.

At the outset, it should be appreciated that, at the high clock frequencies at which current digital circuits operate, conductive region on a signal plane such as S3 (layer 6 of FIG. 1A) surrounded by ground and/or reference voltage planes operates substantially as a transmission line. Thus for every signal current, there will be return or image current in the opposite direction at some location(s). At high frequencies, most return current for a transmission line travels on the nearest reference plane.

The return current must eventually return to the same plane from which it is drawn and the current loop may or may not be complete or closed (e.g. without traversing a power supply at a different voltage). Thus when the driver circuit 16 transitions from a high to low output state connected to signal layer S3 (layer 6), the return current principally travels in the adjacent ground layer 7. The current path is closed and little delta-I noise results.

However, when the driver circuit 16 output transitions from low to high, as illustrated by solid arrows in FIG. 1B, the V2 voltage on the V2 plane (layer 1) is connected to a conductive region on the S3 plane (layer 6). As the signal propagates in the S3 plane, the return or image current is reflected principally in the adjacent ground layer 7, with some in the V1 plane (layer 5), as indicated by dashed arrows. This current path is not closed and substantial delta-I noise results due to the return of current from ground or V1 to V2 through decoupling capacitors. Further, this path is physically longer than the path for the high to low transition and has increased resistance and loop-inductance.

Figure 3A:
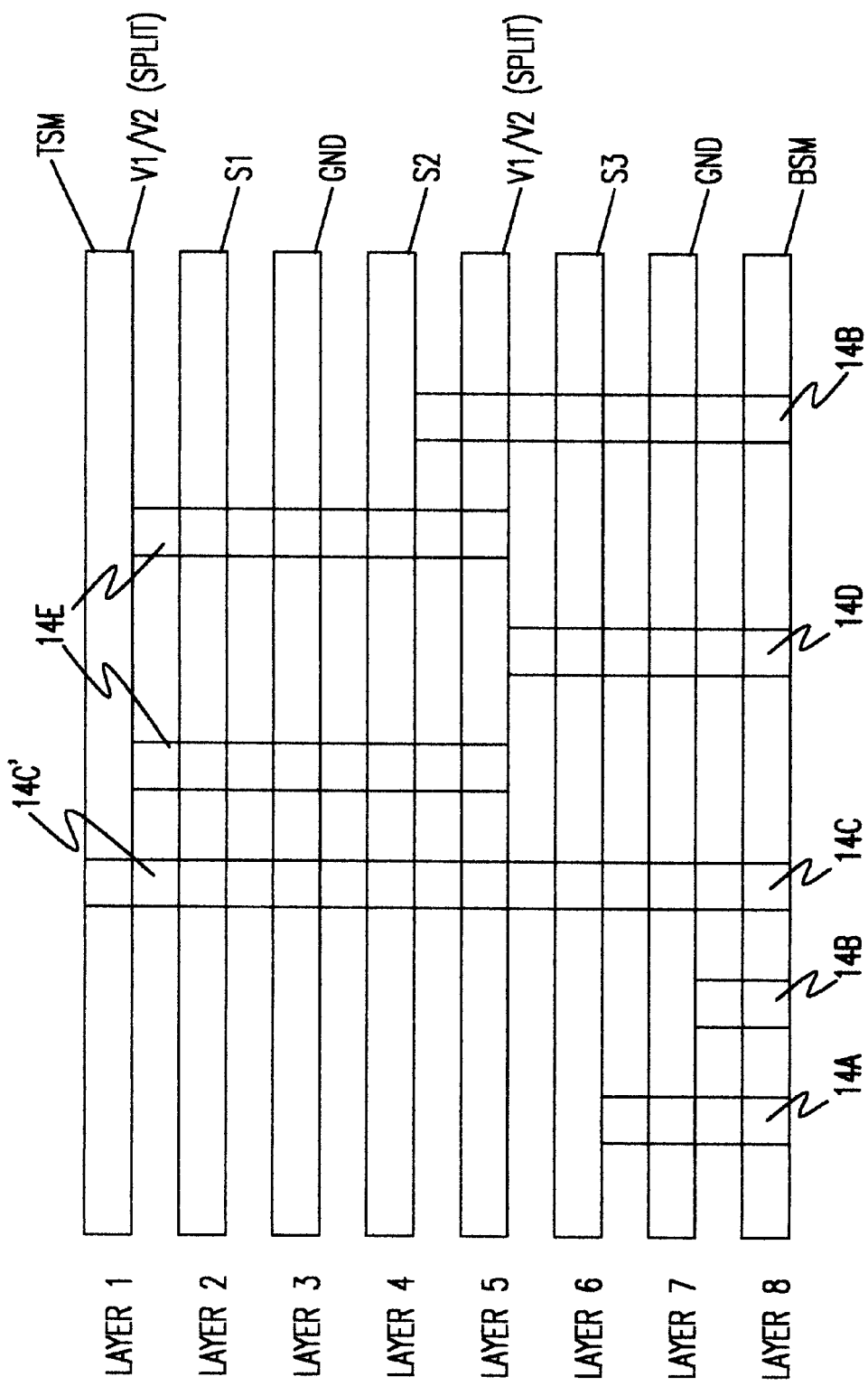
FIG. 3A is a schematic, exploded, side cross-sectional view of an exemplary multi-voltage package design in accordance with the invention, FIG. 3B includes a portion of the view of FIG. 3A illustrating the avoidance of delta-I noise in accordance with the invention.
Figure 4:
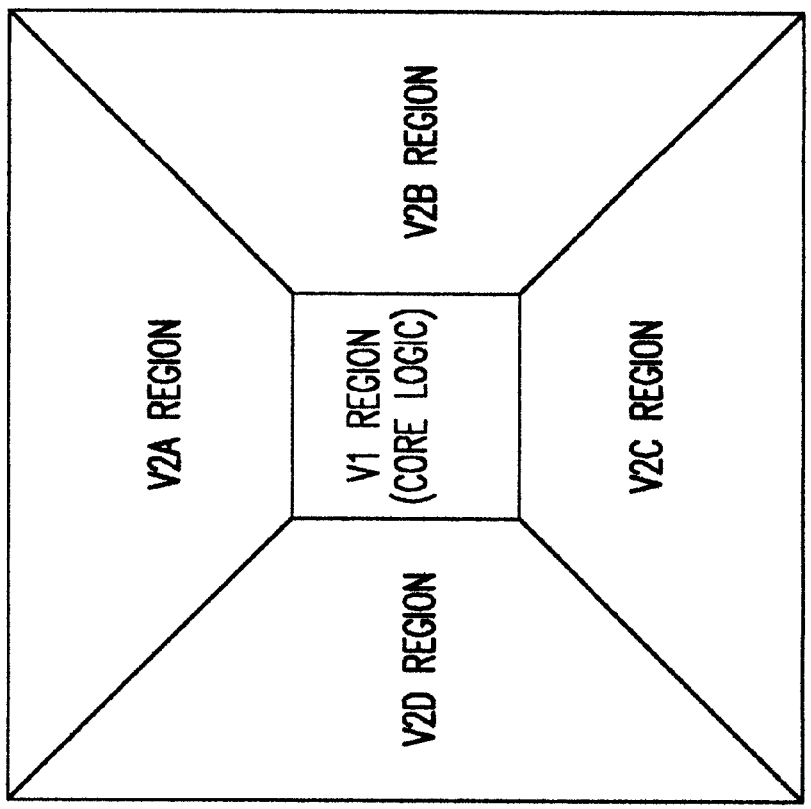
FIG. 4 is a plan view of the partitioned V2 voltage plane of the package of FIG. 3A.

Referring now to FIGS. 3A and 4 the multi-layer structure in accordance with the invention will now be described and explained. The gross physical structure in regard to patterned conductor layers separated by insulating layers is the same as that of FIG. 1A. The patterning of the conductive layers is similarly substantially arbitrary but some additional flexibility is provided, as will be discussed below. The principal characteristic of the invention is that voltage distribution in the conductive pattern on the bottom of layer 1 and voltage distribution on the bottom of layer 5 are both partitioned or split to carry both V1 and V2 voltages. An exemplary partitioning of a voltage distribution layer is shown in FIG. 4. Again, the locations of divisions between different regions which are intended to carry different voltages is also substantially arbitrary but it is preferred and generally convenient to provide a V1 voltage area centrally of the layer (or centrally of the location intended for mounting and connection of a chip). Diagonal separation of V2 voltage areas, if provided, is also preferred for the reasons discussed above.

The partitioning or splitting of the power layers 1 and 5 also allows a significant difference in via structures compared to FIG. 1A. Specifically, while via 14a is an exemplary connection to the S3 signal layer, via 14b is an exemplary connection to ground layer 7, via 14c is an exemplary connection to the V1 area of layer 5 and via 14c' is an exemplary connection from V1 to the chip are effectively the same as those of FIG. 1A, via 14d need only reach to layer 5 and a plurality of further vias 14e, possibly of reduced size, complete the connection to layer 1 and/or the chip. This division of the current reduces the effective resistance/voltage drop of each via and reduces the self-inductance of the package.

Figure 3B:
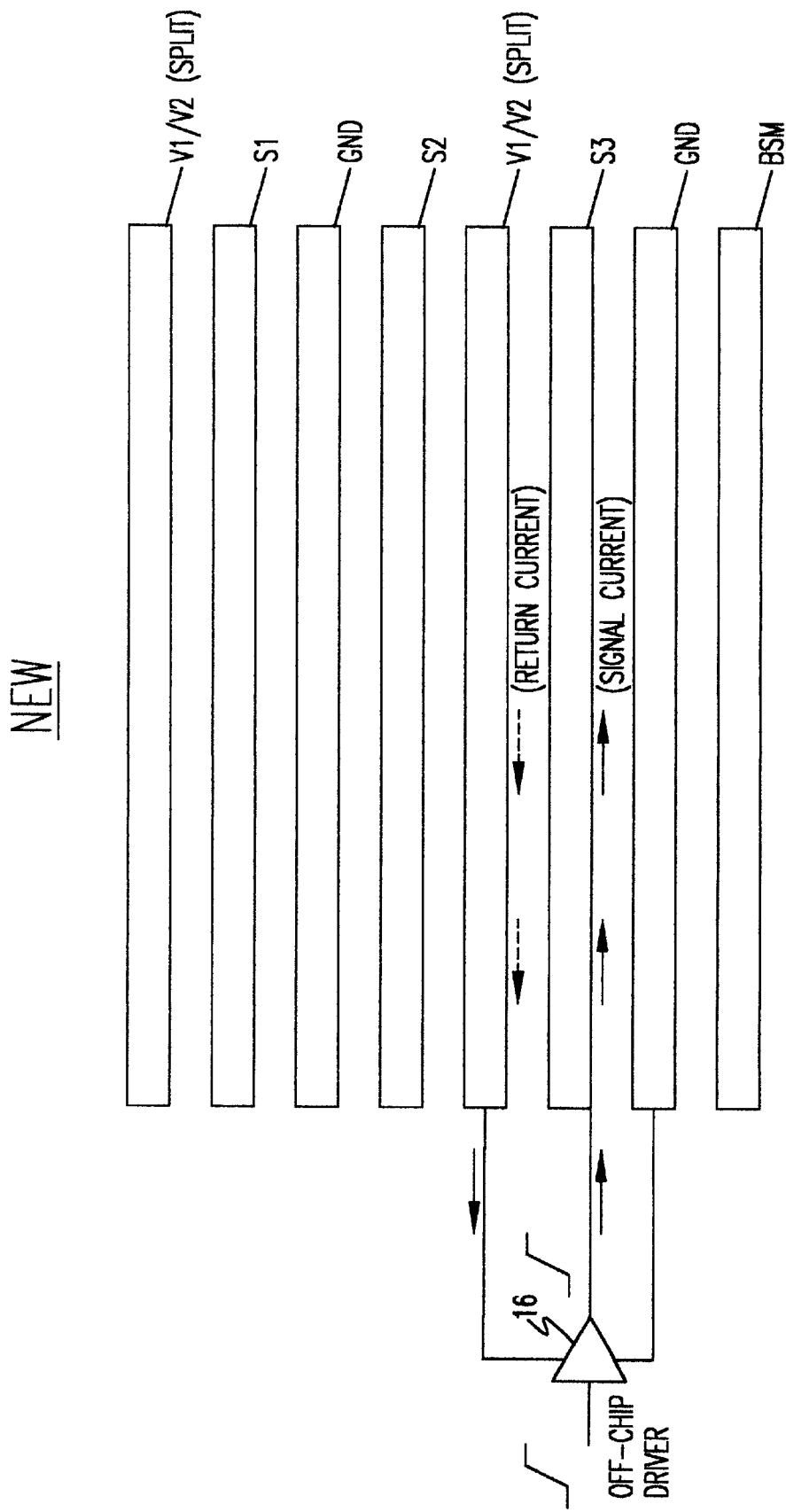

The reduction of delta-I noise in accordance with the invention will now be discussed in connection with FIG. 3B. The high to low transition causes a return or image current on ground layer 7, in the same manner as described above in connection with FIG. 1B. However, as can be seen from FIG. 3B, the return or image current path for the low to high transition is principally carried on the V2 portion of layer 5 and the current path is similarly complete or closed. Therefore, very little delta-I noise will be generated. Further, the small amount of noise generated is symmetric for both layers 5 and 7 and both output signal transition directions. Accordingly, a substantial degree of noise cancellation can be statistically projected over the large number of switching devices on current and foreseeable chips. Additionally, the current path length is much reduced and distributed (e.g. over plural vias 14e), as well; both serving to reduce self-inductance of the multi-layer structure. Thus delta-I noise is minimized through a plurality of mechanisms.

These effects of delta-I noise reduction are also derived for all signal planes (e.g. S1 and S2 as well as S3) in the multi-layer structure of FIG. 3A and are referenced to the correct voltage supplies on adjacent power planes. The return or image current paths are all closed or complete and the length of current loops is reduced and made largely symmetrical for both signal transitions. Via length can also be reduced and current distributed to reduce self-inductance.

Several other important advantages accrue from the splitting of the power planes to include V1 and V2 voltages in accordance with the invention. Specifically, it is preferred that the V1 area of the power layers be somewhat smaller than the chip or die in order to also include V2 voltage chip connections. Therefore, it is preferable to place all V1 BSM connections under the die area to minimize the length thereof and many BSM connections allocated to V1 in previous designs can simply be eliminated since additional distribution and connections that may be required by the chip or die can be accommodated in the power layers and with vias therefrom. Therefore, BSM connection locations which are not needed for V1 can be allocated to V2 to further reduce the self-inductance of the multi-layer structure. The signal to V2 loop inductance is also reduced, further reducing delta-I noise.

At the same time, all BSM connections under the chip or die areas can now be dedicated to V1 and ground. This lowers the self-inductance of both the V1 and Ground connections and the V1-ground loop inductance. A highly coupled and direct vertical power feed is thus provided to the core logic reducing voltage fluctuations with current and reducing the potential for switching/data errors.

In view of the foregoing it is seen that the invention provides substantial reduction in delta-I noise through a plurality of mechanisms and design refinements made possible through partitioning of the power layers to accommodate both V1 and V2 voltages which significantly reduce loop inductance and self-inductance to very low levels which are substantially minimized. By the same token, the noise levels attributable to the power distribution network is so significantly reduced that good operating margins and signal-to-noise ratios can be maintained to signal levels well below those for generations of technology currently being developed.

While the invention has been described in terms of a single preferred embodiment, those skilled in the art will recognize that the invention can be practiced with modification within the spirit and scope of the appended claims. For example, the principles of the invention are applicable to both single and multi-chip packaging but are not limited to power and signal connections to a chip. The principles of the invention are equally applicable to any power and high frequency signal networks in, for example, multiple wiring layers on the chip itself or circuit boards to which single or multiple chip packages may be attached.

Additionally, it is not necessary that the power layers such as the V1/V2 layers or planes of FIG. 3 be similarly partitioned, limited to power distribution (e.g. signal connections may be included in a power layer and vice-versa) or even carry all voltages that are present in the package or on the chip. It is only necessary to provide power distribution in any given plane proximate to portions of signal connections in an adjacent plane at voltages that may be present therein in order to obtain significant reduction in delta-I noise and other advantages of the invention.

What is claimed is:

1. A multi-layer connection structure forming a power distribution network for a plurality of voltages and ground, said multi-layer connection structure comprising alternating layers of patterned conductive layers and insulating layers, alternating ones of said plurality of patterned conductive layers being power distribution layers and signal layers, respectively, alternating ones of said power distribution layers being ground and voltage distribution layers, respectively, and vias selectively connecting selected conducting regions of said patterned conductive layers, wherein a voltage distribution layer is partitioned into respective areas for respective ones of said plurality of voltages that may appear in signal connections in an adjacent layer.

2. A multi-layer connection structure as recited in claim 1, wherein said voltage distribution layer is partitioned to provide respective areas for each of said plurality of voltages.

3. A multi-layer connection structure as recited in claim 1 formed on an integrated circuit chip.

4. A multi-layer connection structure as recited in claim 1, further including an integrated circuit chip connected thereto.

5. A multi-layer connection structure as recited in claim 1, further including a plurality of vias connecting a said area of a first voltage distribution layer to an area of a second voltage distribution area.

6. A multi-layer connection structure as recited in claim 1, wherein a said voltage distribution plane is partitioned into a central area and a surrounding area.

7. A multi-layer connection structure as recited in claim 6, wherein said surrounding area is further partitioned into diagonally separated areas.

8. A multi-layer connection structure as recited in claim 1, wherein said voltage layer includes a signal connection and an adjacent signal layer includes a voltage connection proximate to a portion of said signal connection.

9. An integrated circuit device including a multi-layer connection structure forming a power distribution network for a plurality of voltages and ground, said multi-layer connection structure comprising alternating layers of patterned conductive layers and insulating layers, alternating ones of said plurality of patterned conductive layers being power distribution layers and signal layers, respectively, alternating ones of said power distribution layers being ground and voltage distribution layers, respectively, and vias selectively connecting selected conducting regions of said patterned conductive layers, wherein a voltage distribution layer is partitioned into respective areas for respective ones of said plurality of voltages that may appear in signal connections in an adjacent layer.

10. An integrated circuit device as recited in claim 9, wherein said voltage distribution layer is partitioned to provide respective areas for each of said plurality of voltages.

11. An integrated circuit device as recited in claim 9, further including a plurality of vias connecting a said area of a first voltage distribution layer to an area of a second voltage distribution area.

12. An integrated circuit device as recited in claim 9, wherein a said voltage distribution plane is partitioned into a central area and a surrounding area.

13. An integrated circuit device as recited in claim 12, wherein said surrounding area is further partitioned into diagonally separated areas.

14. An integrated circuit device as recited in claim 9, wherein said voltage layer includes a signal connection and an adjacent signal layer includes a voltage connection proximate to a portion of said signal connection.

* * * * *